United States Patent
Araki et al.

(10) Patent No.: US 12,093,613 B2
(45) Date of Patent: Sep. 17, 2024

(54) ANOMALY DETECTION SYSTEM, METHOD AND PROGRAM, AND DISTRIBUTED CO-SIMULATION SYSTEM

(71) Applicants: KABUSHIKI KAISHA TOSHIBA, Tokyo (JP); Toshiba Digital Solutions Corporation, Kawasaki (JP)

(72) Inventors: Dai Araki, Tokyo (JP); Hirotaka Kitahara, Fuchu Tokyo (JP); Katsumi Takahashi, Niiza Saitama (JP); Masayuki Nemoto, Kawasaki Kanagawa (JP)

(73) Assignees: Kabushiki Kaisha Toshiba, Tokyo (JP); Toshiba Digital Solutions Corporation, Kawasaki (JP)

(*) Notice: Subject to any disclaimer, the term of this patent is extended or adjusted under 35 U.S.C. 154(b) by 92 days.

(21) Appl. No.: 17/932,638

(22) Filed: Sep. 15, 2022

(65) Prior Publication Data

US 2023/0306151 A1    Sep. 28, 2023

Related U.S. Application Data

(63) Continuation of application No. PCT/JP2022/013597, filed on Mar. 23, 2022.

(51) Int. Cl.
*G06F 11/00* (2006.01)
*G06F 11/07* (2006.01)
*G06F 30/20* (2020.01)

(52) U.S. Cl.
CPC .......... *G06F 30/20* (2020.01); *G06F 11/0706* (2013.01); *G06F 11/0754* (2013.01)

(58) Field of Classification Search
CPC .............. G06F 11/302; G06F 11/0706
(Continued)

(56) References Cited

U.S. PATENT DOCUMENTS 6,772,107 B1 * 8/2004 La Cascia, Jr. ...... G06F 11/3495
703/22
11,189,112 B1 * 11/2021 Konrardy ............... G16Y 10/80
(Continued)

FOREIGN PATENT DOCUMENTS

JP    2006-172128 A    6/2006

OTHER PUBLICATIONS

Dai Araki et al., "Examination of step response delay compensate on method in distributed co-simulation," Soc. of Auto. Eng. of Japan, 2021 Spring Conf. Academic Lecture, 6 pages, and translation, 7 pages (May 21, 2021).

(Continued)

*Primary Examiner* — Sarai E Butler
(74) *Attorney, Agent, or Firm* — Finnegan, Henderson, Farabow, Garrett & Dunner, LLP

(57) ABSTRACT

An anomaly detection system according to an embodiment is an anomaly detection system that executes anomaly detection of each of one or a plurality of simulators by using a controller. The controller causes each simulator to start a process of simulation, to transmit to the controller an existence notification indicative of existence of the simulator, at a predetermined cycle until an end of the process of simulation, and to transmit to the controller an end notification indicative of an end of the process if the process ends; determines that the simulator that is a transmission source of the existence notification is normal; determines that the process of the simulator that is a transmission source of the end notification ends, upon receiving the end notification; and detects that an anomaly occurs in the simulator.

14 Claims, 7 Drawing Sheets

(58) Field of Classification Search
USPC .................................................. 714/1–57
See application file for complete search history.

(56) References Cited

U.S. PATENT DOCUMENTS

| | | | |
|---|---|---|---|
| 2006/0129880 A1* | 6/2006 | Arcese | G06F 11/3672 |
| | | | 714/11 |
| 2009/0024381 A1* | 1/2009 | Sakamoto | G06F 11/3664 |
| | | | 703/26 |
| 2009/0112568 A1* | 4/2009 | Doerfel | G06F 11/3457 |
| | | | 703/22 |
| 2013/0111266 A1* | 5/2013 | Tosaka | G06F 11/366 |
| | | | 714/28 |
| 2014/0009452 A1* | 1/2014 | Shiohara | G06T 1/00 |
| | | | 345/94 |
| 2018/0285178 A1* | 10/2018 | Giroux | G06F 11/0784 |
| 2018/0285179 A1* | 10/2018 | Giroux | G06F 30/20 |
| 2020/0073740 A1 | 3/2020 | Ohana et al. | |
| 2022/0374260 A1* | 11/2022 | Zhang | G06F 9/4843 |

OTHER PUBLICATIONS

IEEE Computer Soc., "IEEE Standard for Modeling and Simulation (M&S) High Level Architecture (HLA)—Federate Interface Specification," *IEEE Std* 1516.1-2010, 378 pages, doi:10.1109/IEEESTD.2010.5557728 (2010).

Modelica Assoc., "Distributed Co-Simulation Protocol (DCP)," Version: 1.0.0, 112 pages (2019).

Hiroshi Takemiya et al., "Implementation of Large-scale Long-run Grid Applications with Varying Problems," Trans. of Inf. Proc. Soc. of Japan, vol. 47, No. SIG 18 (ACS 16), pp. 31-43, and translation, 25 pages (2006).

* cited by examiner

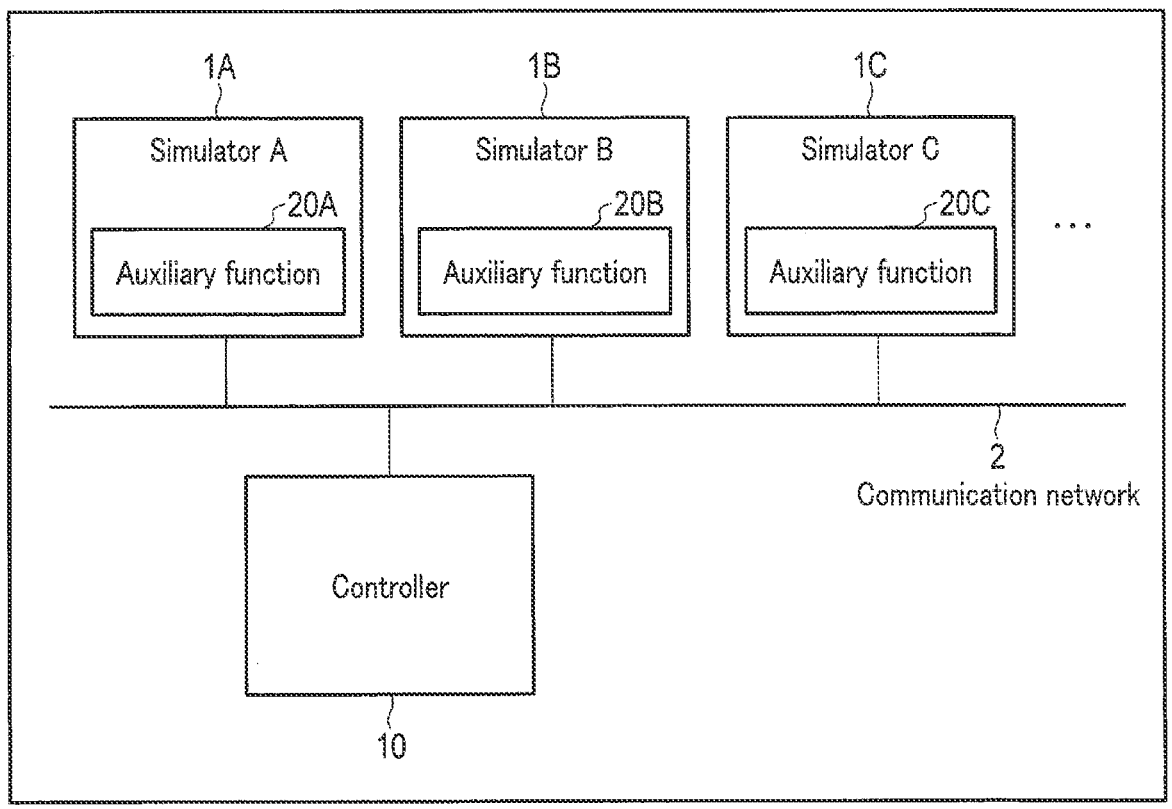
F I G. 1

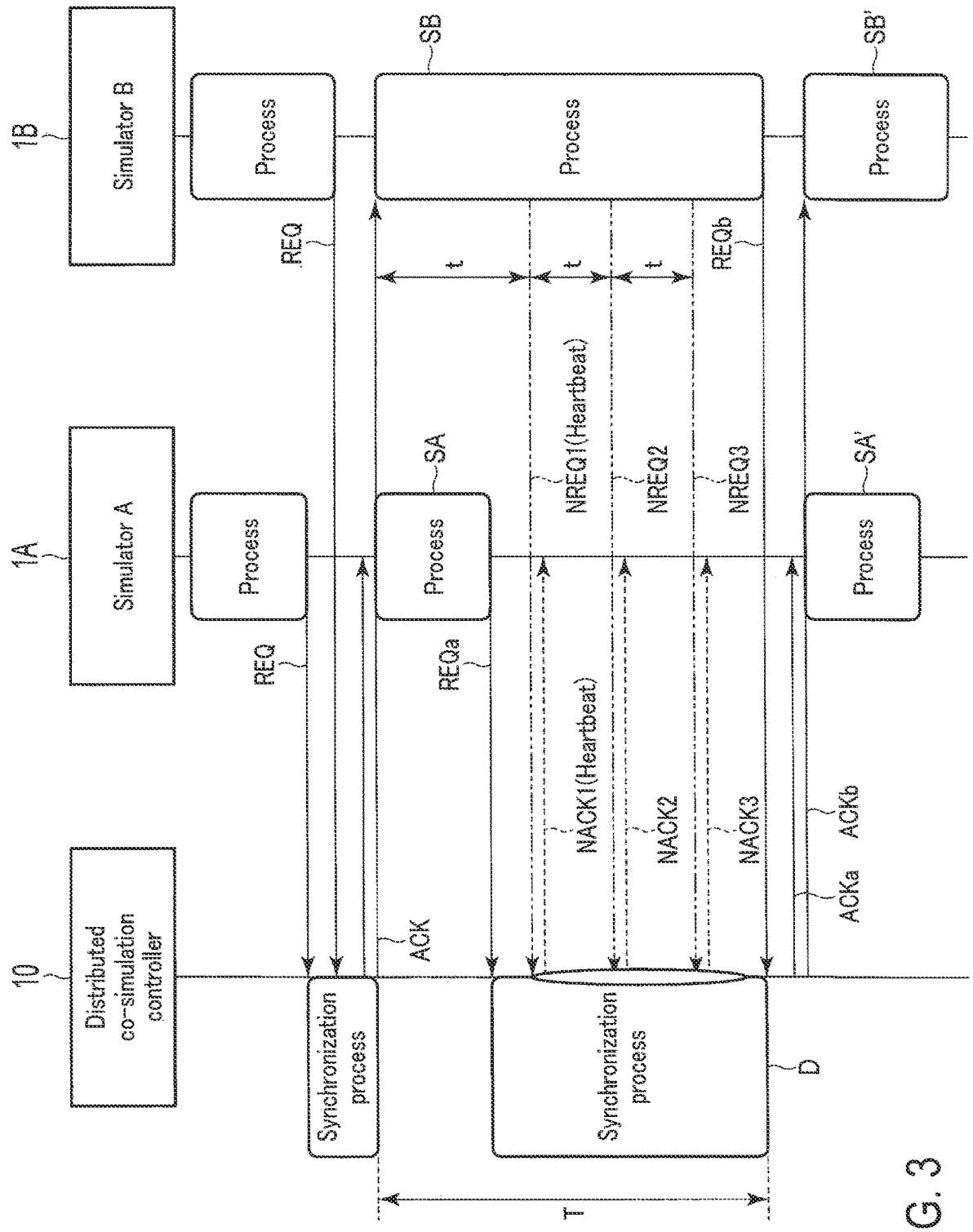
F I G. 3

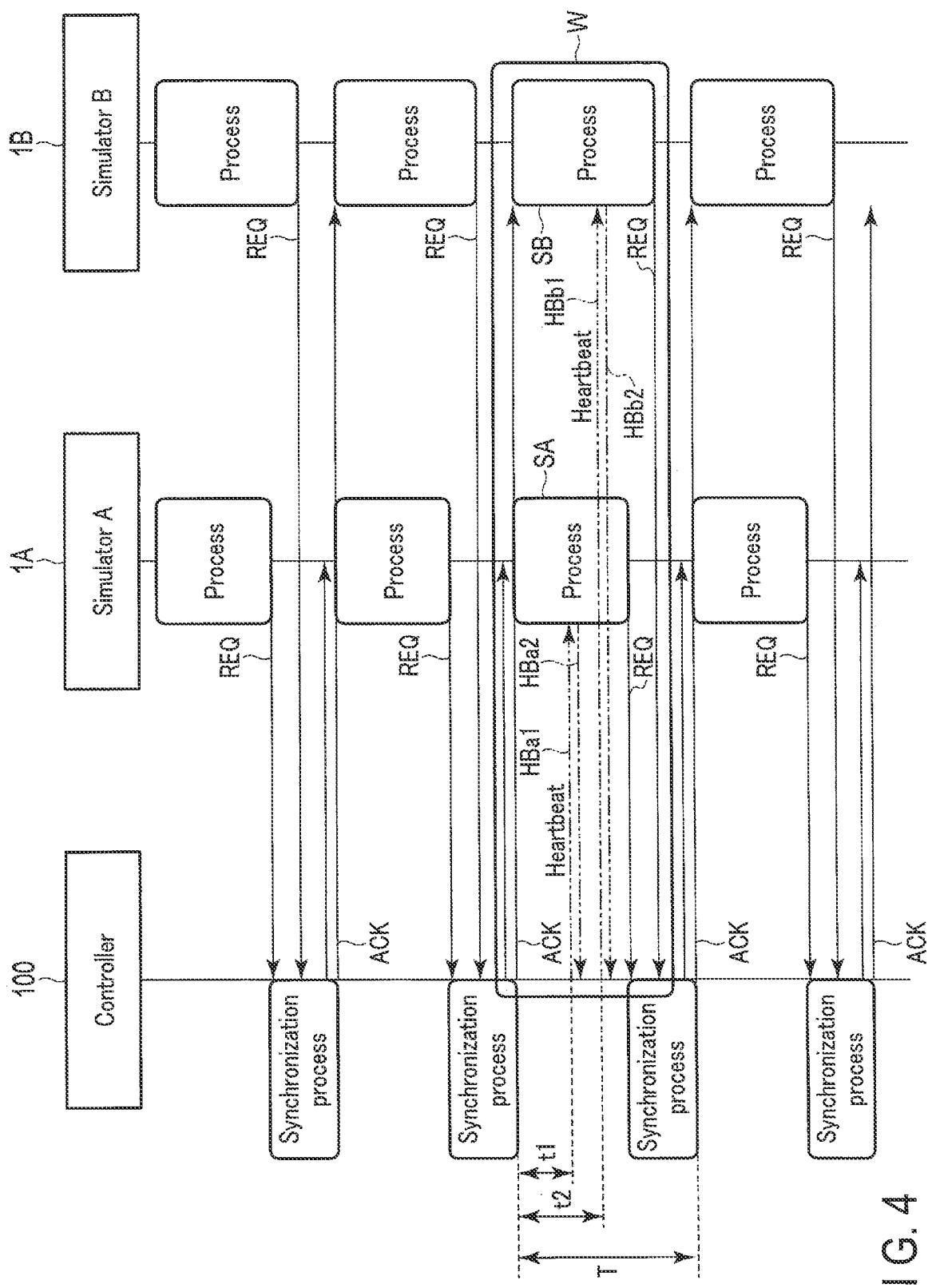
F I G. 4

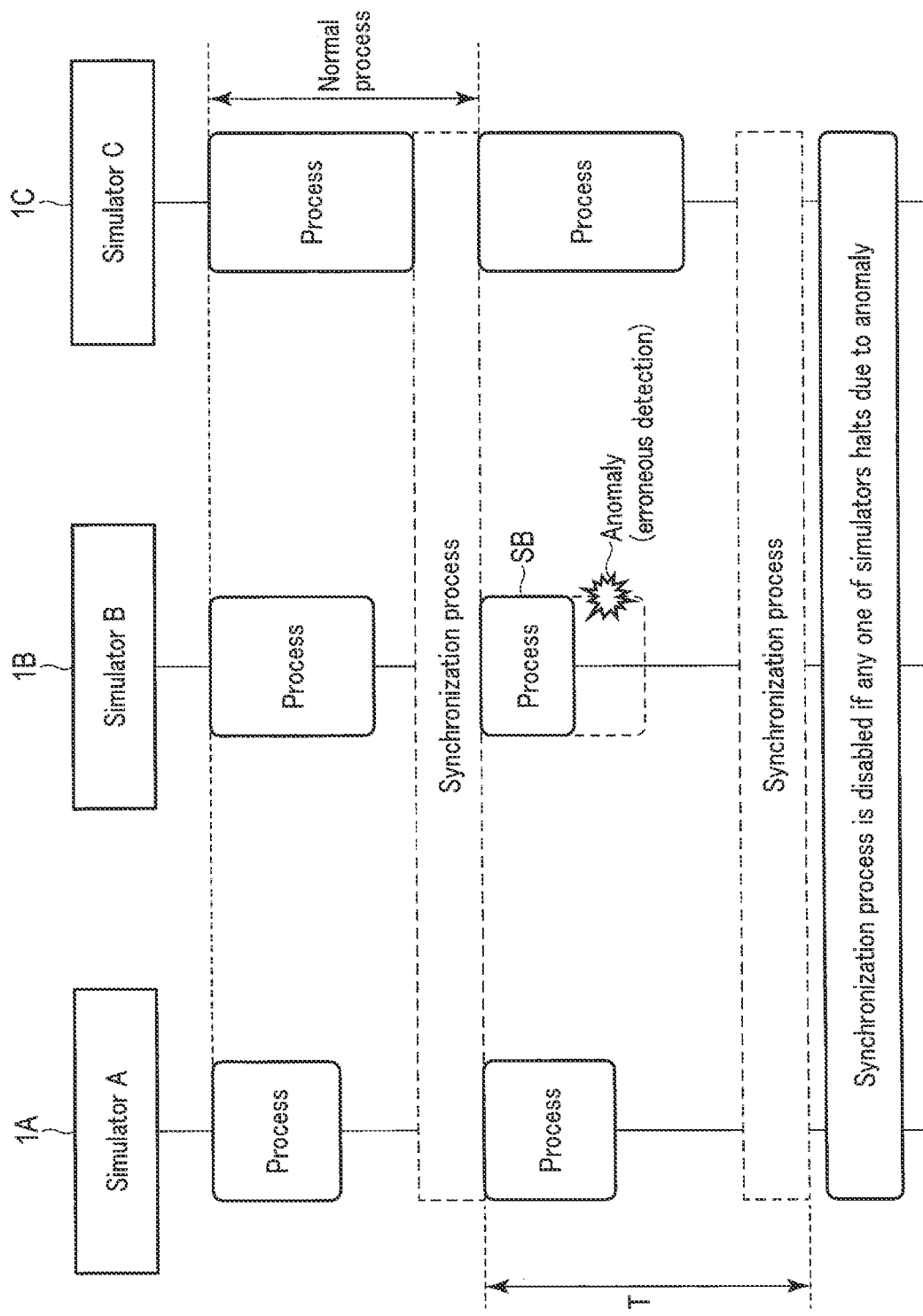
F I G. 6

ANOMALY DETECTION SYSTEM, METHOD AND PROGRAM, AND DISTRIBUTED CO-SIMULATION SYSTEM

CROSS REFERENCE TO RELATED APPLICATIONS

This application is a Continuation Application of PCT Application No. PCT/JP2022/013597, filed Mar. 23, 2022, the entire contents of all of which are incorporated herein by reference.

FIELD

Embodiments described herein relate generally to an anomaly detection system, method and program, and a distributed co-simulation system, which can execute anomaly detection of a simulator.

BACKGROUND

Conventionally, in distributed simulation that is performed by a plurality of simulators, when a synchronization process is disabled by a communication anomaly or a simulator anomaly, it is necessary to periodically and continuously examine, from the outside, whether a target is operating, by an existence monitoring confirmation signal that is a signal different from synchronization communication of simulation, or to monitor a heartbeat signal notifying at regular intervals to the outside that a target itself is normally operating, thereby detecting a simulator in which an anomaly occurs, and separating the detected simulator or ending the simulation.

In the above-described distributed simulation, however, a certain length of time is required until detecting the simulator in which an anomaly occurs, and the transmission of the existence monitoring confirmation or the heartbeat incurs an increase in communication load, leading to a decrease in simulation speed.

In addition, in particular, in a multicast method such as UDP (User Datagram Protocol) communication, in some cases, a retransmission technology or an interpolation technology is assembled as a countermeasure to packet loss at a time of anomaly. Even when these technologies are applied, there is concern that due to an increase in communication load, the simulation speed lowers and furthermore the precision of the simulation result lowers.

The problem to be solved by the present invention is to provide an anomaly detection system, method and program, and a distributed co-simulation system, which can suppress an increase in communication load.

BRIEF DESCRIPTION OF THE DRAWINGS

FIG. 1 is a view illustrating a network environment in which an anomaly detection system of the present embodiment is assembled.

FIG. 3 is a view for describing an existence conformation method of a simulator by the distributed co-simulation controller that is applied to the anomaly detection system of the present embodiment.

FIG. 4 is a view for describing an existence conformation method of a simulator by a controller of conventional art.

FIG. 6 is a view for describing an example of erroneous anomaly detection of a simulator by a controller of conventional art.

DETAILED DESCRIPTION

Figure 2:
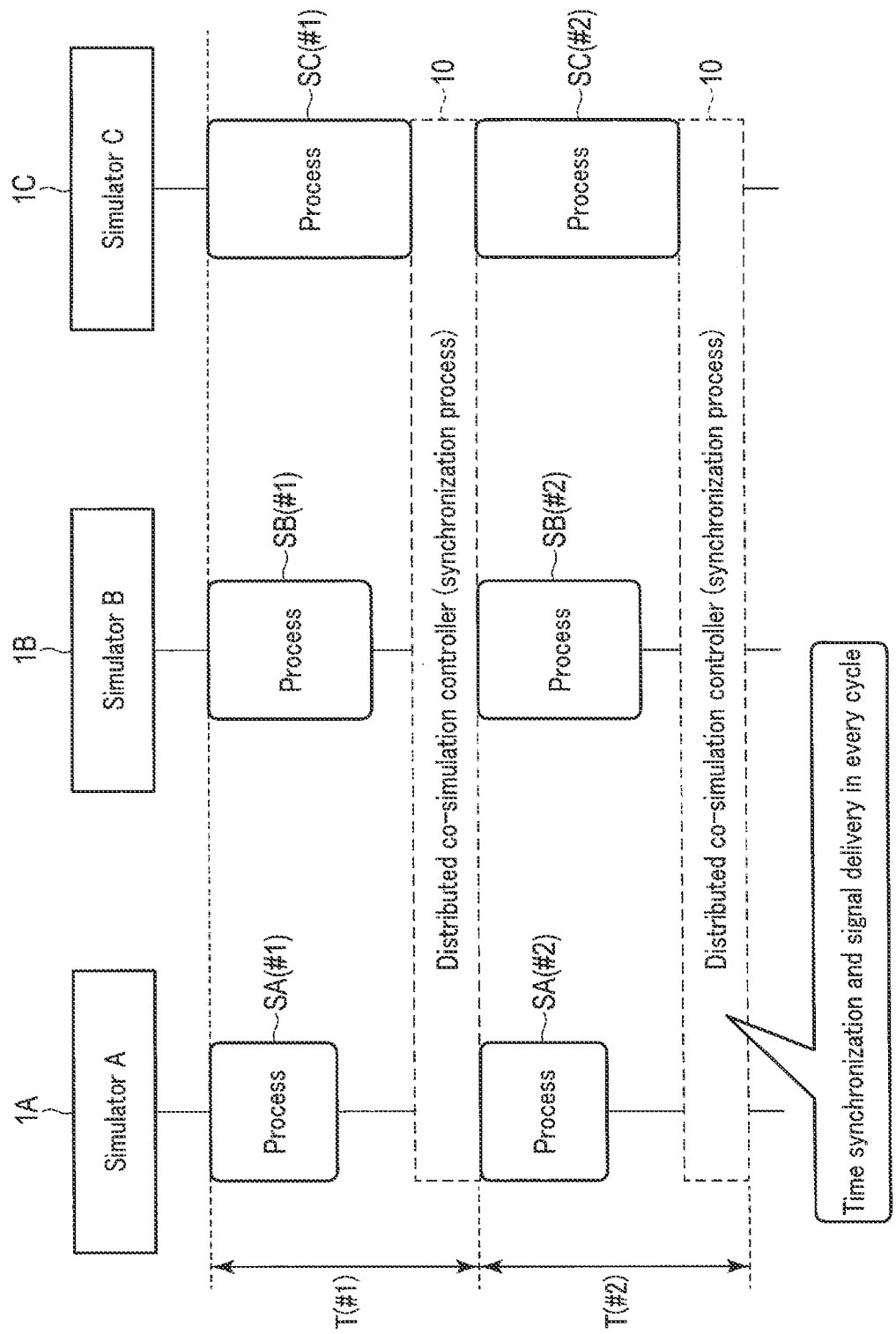
FIG. 2 is a view for describing a cooperation between simulation processes by three simulators 1 (1A, 1B, 1C), and a synchronization process by a distributed co-simulation controller 10.

An anomaly detection system according to an embodiment is an anomaly detection system that executes anomaly detection of each of one or a plurality of simulators by using a controller that executes a synchronization process of the one or plurality of simulators. Here, the controller causes each simulator to start a process of simulation that is to be executed in a predetermined period, to transmit to the controller an existence notification indicative of existence of the simulator, at a predetermined cycle until an end of the process of simulation, and to transmit to the controller an end notification indicative of an end of the process if the process ends; determines that the simulator that is a transmission source of the existence notification is normal, upon receiving the existence notification at the predetermined cycle; determines that the process of the simulator that is a transmission source of the end notification ends, upon receiving the end notification; and detects, if the existence notification is not transmitted at the predetermined cycle from a simulator that is not determined to finish the process, that an anomaly occurs in the simulator.

Hereinafter, embodiments of the present invention will be described with reference to the accompanying drawings. The drawings are schematic or conceptual ones, and the relationship between the thickness and width of each part, and the ratio in size between parts, etc. do not necessarily agree with the actual ones. Even when identical parts are depicted, the parts may be depicted with different dimensions and ratios between the drawings. In the present specification and drawings, the elements similar to those described in connection with preceding drawings are denoted by like reference signs, and a detailed description thereof is omitted unless where necessary.

An anomaly detection system, to which simulator anomaly detection of an embodiment of the present invention is applied, is described.

FIG. 1 is a view illustrating a network environment in which an anomaly detection system of the embodiment of the present invention is assembled.

As exemplarily illustrated in FIG. 1, in an environment in which one or a plurality of simulators 1 (1A, 1B, 1C, . . . ) and a controller 10 are connected via a communication network 2, for example, a public network such as the internet, or a dedicated network, the anomaly detection system executes existence confirmation and anomaly detection of each simulator 1 (1A, 1B, 1C, . . . ) by using the controller 10.

In each simulator (1A, 1B, 1C, . . . ), an auxiliary function 20 (20A, 20B, 20C, . . . ) is assembled for transmitting and receiving necessary information for existence confirmation and anomaly detection of each simulator 1 (1A, 1B, 1C, . . . ), which are executed between each simulator 1 and the controller 10 via the communication network 2. The auxiliary function 20 is implemented, for example, by software written in a memory of the simulator 1, although the auxiliary function 20 is not limited to this.

By cooperating with the auxiliary function 20 (20A, 20B, 20C, . . . ) of each simulator 1 (1A, 1B, 1C, . . . ) the controller 10 executes existence confirmation and anomaly detection of each simulator 1 (1A, 1B, 1C, . . . ).

Note that since the controller 10 also controls a synchronization process of each simulator 1 (1A, 1B, 1C, . . . ), the controller 10 is hereinafter referred to also as "distributed co-simulation controller 10" in the present specification, where necessary. In addition, the anomaly detection system can also be referred to as "distributed co-simulation".

FIG. 2 is a view for describing, as an example, a cooperation between simulation processes by three simulators 1 (1A, 1B, 1C), and a synchronization process by the distributed co-simulation controller 10.

In the example illustrated in FIG. 2, each simulator 1 (1A, 1B, 1C) includes a simulation model of an identical period T(#1) (e.g. several milliseconds). As regards the processing time of simulation executed within the period T(#1), it is assumed that among the three simulators 1A, 1B and 1C, the time of a process SA(#1) by the simulator 1A is shortest, the time of a process SC(#1) by the simulator 1C is longest, and the time of a process SB(#1) by the simulator 1B is intermediate therebetween.

In this case, if the three simulators 1A, 1B and 1C simultaneously start the processes SA(#1), SB(#1) and SC(#1), the process SA(#1) by the simulator 1A ends first, the process SB(#1) by the simulator 1B ends next, and the process SC(#1) by the simulator 1C ends last.

The distributed co-simulation controller 10 causes the simulator 1A to stand by, even after the process SA(#1) by the simulator 1A ends, thereby preventing advancement to a process SA(#2) of simulation of the next period T(#2); causes the simulator 1B to stand by, even after the process by the simulator 1B(#1) ends, thereby preventing advancement to a process SB(#2) of simulation of the next period T(#2); executes a synchronization process of results of the processes SA(#1), SB(#1) and SC(#1) of simulation by the simulators 1A, 1B and 1C if the process SC(#1) by the simulator 1C ends; and causes, after the end of the synchronization process, the simulators 1A, 1B and 1C to start processes SA(#2), SB(#2) and SC(#2) of the next period T(#2).

(Existence Confirmation)

In addition to this synchronization process, the distributed co-simulation controller 10 operates as described below, thereby executing existence confirmation of the simulator 1 (1A, 1B, 1C).

This is described with reference to FIG. 3.

FIG. 3 is a view for describing an existence conformation method of a simulator by the distributed co-simulation controller that is applied to the anomaly detection system of the present embodiment.

In FIG. 3, in order to avoid complexity, only two simulators 1A and 1B are illustrated. However, the distributed co-simulation controller 10 can execute existence confirmation with respect to three or more simulators 1 (1A, 1B, 1C, . . . ).

Specifically, the distributed co-simulation controller 10 causes the auxiliary functions 20A and 20B of the simulators 1A and 1B to start processes SA and SB that are to be executed in an identical period T.

Thereafter, the distributed co-simulation controller 10 causes the auxiliary function 20 of each simulator 1 to transmit an existence notification NREQ (No REQest) to the distributed co-simulation controller 10 as a heartbeat at a predetermined cycle t less than the period T until the end of the process S of simulation, and to transmit, after the end of the process S, an end notification REQ (REQuest) to the distributed co-simulation controller 10. This predetermined cycle t can be set to be variable or invariable (fixed).

Accordingly, in the example illustrated in FIG. 3, in the case of the simulator 1B, after the start of the period T, since the process SB does not end even if the predetermined cycle t is reached, the auxiliary function 20B transmits an existence notification NREQ1 as a heartbeat, the auxiliary function 20B then transmits an existence notification NREQ2 as a heartbeat since the process SB does not end even if the next predetermined cycle t is reached, and the auxiliary function 20B transmits an existence notification NREQ3 as a heartbeat since the process SB does not end even if the further next predetermined cycle t is reached. At last, the process SB ends before the next predetermined cycle t is reached, and the auxiliary function 20B transmits an end notification REQb to the distributed co-simulation controller 10.

On the other hand, in the case of the simulator 1A, after the start of the period T, the process SA ends before the predetermined cycle t is reached, and the auxiliary function 20A transmits an end notification REQa to the distributed co-simulation controller 10.

Upon receiving the end notification REQ, the distributed co-simulation controller 10 determines that the simulator 1 of the auxiliary function 20 that is the transmission source has finished the process S of simulation.

Accordingly, in the example illustrated in FIG. 3, upon receiving the end notification REQa, the distributed co-simulation controller 10 determines that the simulator 1A has finished the process SA.

At this time point, in a case where the end notifications REQ from all simulators 1 are not received, if the NREQ is transmitted from the auxiliary function 20 of the simulator 1 that has not yet transmitted the end notification REQ, the distributed co-simulation controller 10 transmits a NACK (Negative ACKnowledgment) as a heartbeat to the auxiliary function 20 of the simulator 1 that is the transmission source of the end notification REQ, thereby causing the simulator 1 to stand by so as not to execute the process S of simulation of the next period T.

Accordingly, in the example illustrated in FIG. 3, if the NREQ1 is transmitted from the simulator 1B that has not yet transmitted the end notification REQ after the distributed co-simulation controller 10 received the end notification REQa from the simulator 1A, the distributed co-simulation controller 10 transmits NACK1 as a heartbeat to the simulator 1A, thereby causing the simulator 1A to stand by so as not to execute a process SA' of simulation of the next period T.

In addition, if the distributed co-simulation controller 10 receives the existence notification NREQ at the predetermined cycle t from the auxiliary function 20 of an identical simulator 1, the distributed co-simulation controller 10 determines that the simulator 1 of the auxiliary function 20 that is the transmission source is normally executing the process S of simulation.

Accordingly, in the example illustrated in FIG. 3, the distributed co-simulation controller 10 determines that the simulator 1B is normally executing the process SB, by receiving the existence notifications NREQ1, NREQ2 and NREQ3 at the cycle t.

Then, upon receiving the end notifications REQ from all simulators 1, the distributed co-simulation controller 10 executes a synchronization process D, and, after the execution of the synchronization process D, transmits ACK (ACKnowledgment) to each simulator 1 and causes each simulator 1 to start a process of simulation that is to be executed in the next period T.

Accordingly, in the example illustrated in FIG. 3, the distributed co-simulation controller 10 completes the reception of the end notifications REQa and REQb from all simulators 1A and 1B, by receiving the end notification REQb from the simulator 1B. Thereby, the distributed co-simulation controller 10 executes the synchronization process D, and, after the execution of the synchronization process D, transmits ACKa and ACKb to the auxiliary functions 20A and 20B of the simulators 1A and 1B and causes each simulator 1A, 1B to start a process SA', SB' of simulation that is to be executed in the next period T. Then, also in the next period T, the above-described operation is repeated to continue the process.

According to the above-described existence confirmation method, compared to conventional art, the communication load can be reduced with respect to two viewpoints. As regards the first viewpoint, as illustrated in FIG. 3, in the present method, existence confirmation is not constantly executed between the distributed co-simulation controller 10 and the simulator 1A, 1B, but the existence confirmation is executed only during the synchronization process, and thereby the communication load can be reduced. As regards the second viewpoint, existence confirmation is not executed by two-way reciprocal communication, but is executed by one-way communication, and thereby the communication load can be reduced.

The second viewpoint is described with reference to FIG. 4.

FIG. 4 is a view for describing an existence conformation method of a simulator by a controller of conventional art.

In FIG. 4, unlike FIG. 3, not the distributed co-simulation controller 10 but a controller 100 of conventional art executes existence confirmation of the simulator 1A, 1B.

In particular, as indicated by W in FIG. 4, if the synchronization process of a preceding period T ends, the controller 100 transmits a heartbeat HB to each simulator 1 in a predetermined cycle t less than the period T. The predetermined cycle t may be different, or may be identical, between the simulators 1. FIG. 4 illustrates an example in which the controller 100 transmits a heartbeat HBa1 to the simulator 1A at a predetermined cycle t1, and a heartbeat HBb1 to the simulator 1B at a predetermined cycle t2 that is longer than the predetermined cycle t1.

Upon receiving the heartbeat HB, each simulator 1 returns a heartbeat HB to the controller 100. Accordingly, in the case as illustrated in FIG. 4, upon receiving the heartbeat HBa1 from the controller 100, the simulator 1A returns a heartbeat HBa2 to the controller 100, and, upon receiving the heartbeat HBb1 from the controller 100, the simulator 1B returns a heartbeat HBb2 to the controller 100.

The controller 100 confirms the existence of the simulator 1 that is the transmission source of the heartbeat HB, by receiving the heartbeat HB that is returned from each simulator 1. In the case as illustrated in FIG. 4, the controller 100 confirms the existence of the simulator 1A by receiving the heartbeat HBa2 from the simulator 1A, and confirms the existence of the simulator 1B by receiving the heartbeat HBb2 from the simulator 1B.

In this manner, according to the conventional art, the existence confirmation of one simulator 1 requires a reciprocation of heartbeats HB, i.e. the transmission of two heartbeats HB, in such a manner that the controller 100 first transmits the heartbeat HB to each simulator 1, and each simulator 1 returns, as a response thereto, the heartbeat HB to the controller 100. Accordingly, as illustrated in FIG. 4, when the existence confirmation of two simulators 1A and 1B is executed, the transmission of four heartbeats HB is required.

Since such transmission of heartbeats HB is executed in overlap with an ordinary communication process, the number of reciprocal transmissions of heartbeats HB increases as the number of simulators 1 handled by the controller 100 increases, leading to an increase in communication load.

By contrast, in the present embodiment, the distributed co-simulation controller 10 does not transmit a heartbeat to each simulator 1, and the simulator 1 transmits a heartbeat to the distributed co-simulation controller 10. In addition, by receiving the transmitted heartbeat, the distributed co-simulation controller 10 confirms the existence of the simulator 1 that is the transmission source. Specifically, the transmission of the heartbeat is not reciprocal but is only one-way, and therefore the existence confirmation of the simulator can be executed while an increase in communication load due to the transmission of heartbeats is more suppressed than in the conventional art.

(Anomaly Detection)

In addition, in the present embodiment, if the end notification REQ is not transmitted, or the existence notification NREQ is not transmitted at the predetermined cycle t, from a certain auxiliary function 20, the distributed co-simulation controller 10 detects that an anomaly (for example, crash, or communication anomaly) occurred in the simulator 1 of this auxiliary function 20.

This is described with reference to FIG. 5.

Figure 5:
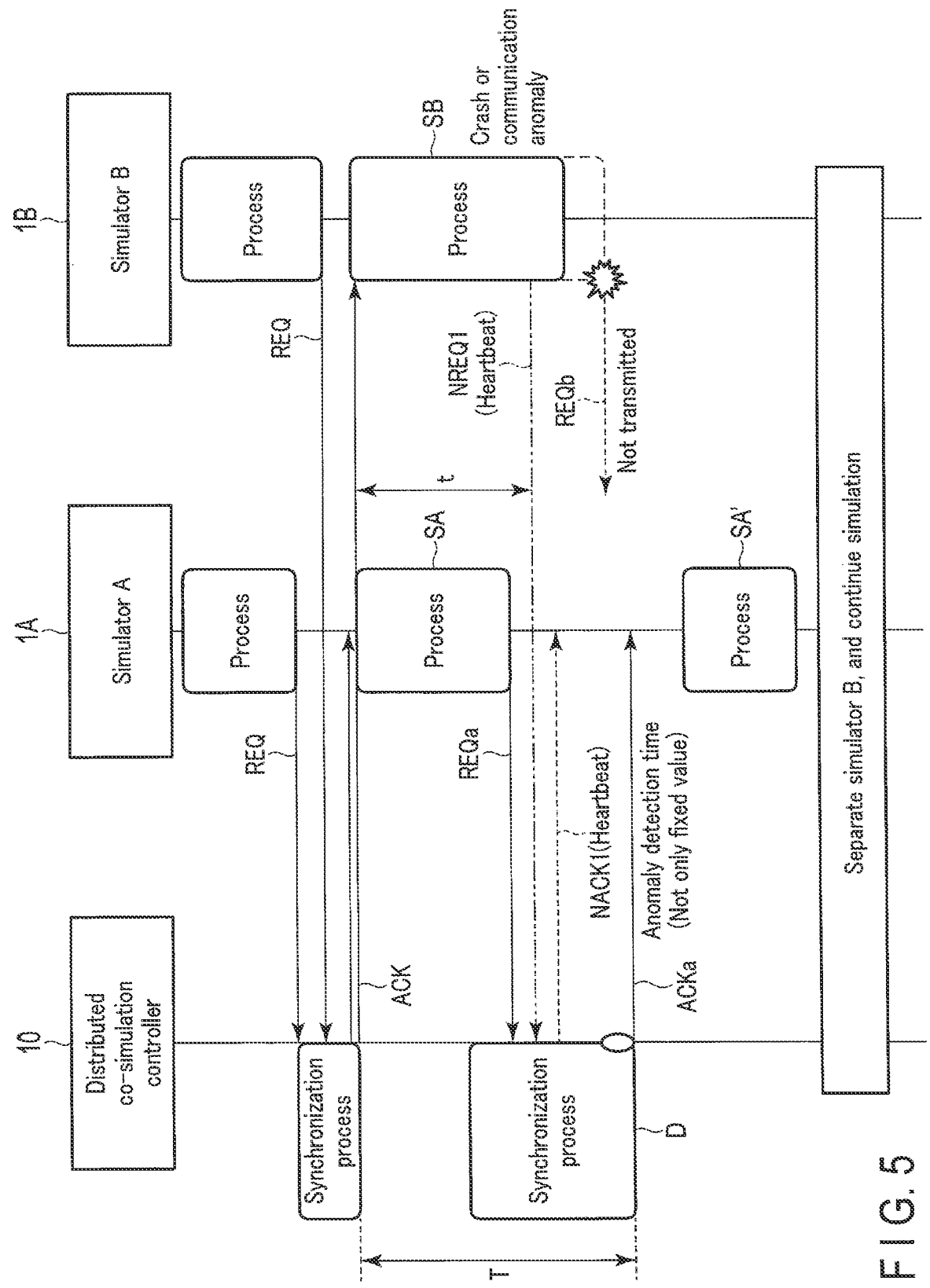
FIG. 5 is a view for describing an anomaly detection method of a simulator by the distributed co-simulation controller that is applied to the anomaly detection system of the present embodiment.

FIG. 5 is a view for describing an anomaly detection method of a simulator by the distributed co-simulation controller that is applied to the anomaly detection system of the present embodiment.

In the case exemplarily illustrated in FIG. 5, after the start of the period T, when the predetermined cycle t was reached, the simulator 1B had not finished the process SB. Thus, the auxiliary function 20B transmitted the existence notification NREQ1. Then, although the process SB was finished before the next cycle t was reached, communication with the distributed co-simulation controller 10 was disabled due to a crash or communication anomaly, and the end notification REQb could not be transmitted from the auxiliary function 20B.

As a result, since the distributed co-simulation controller 10 receives neither the end notification REQb nor the existence notification NREQ from the simulator 1B, the distributed co-simulation controller 10 detects that an anomaly occurred in the simulator 1B. Then, the distributed co-simulation controller 10 separates the simulator 1B in which the occurrence of anomaly was detected, and subsequently transmits ACKa to only the simulator 1A in order to continue the process by the simulator 1A alone. ACKa is received by the auxiliary function 20A of the simulator 1A, and, responding to this, the simulator 1A starts the process SA' of the next period T. Since ACKb is not transmitted to the simulator 1B, the simulator 1B is separated from the synchronization process without starting the process SB' of the next period T.

In the conventional art, the synchronization process is disabled if an anomaly occurs in any one of simulators 1. However, according to the above-described anomaly detection method, the simulator 1, in which an anomaly occurred, is detected and is separated from the synchronization process, and the synchronization process can be continued by operating only the simulator 1 in which no anomaly occurs.

Figure 7:
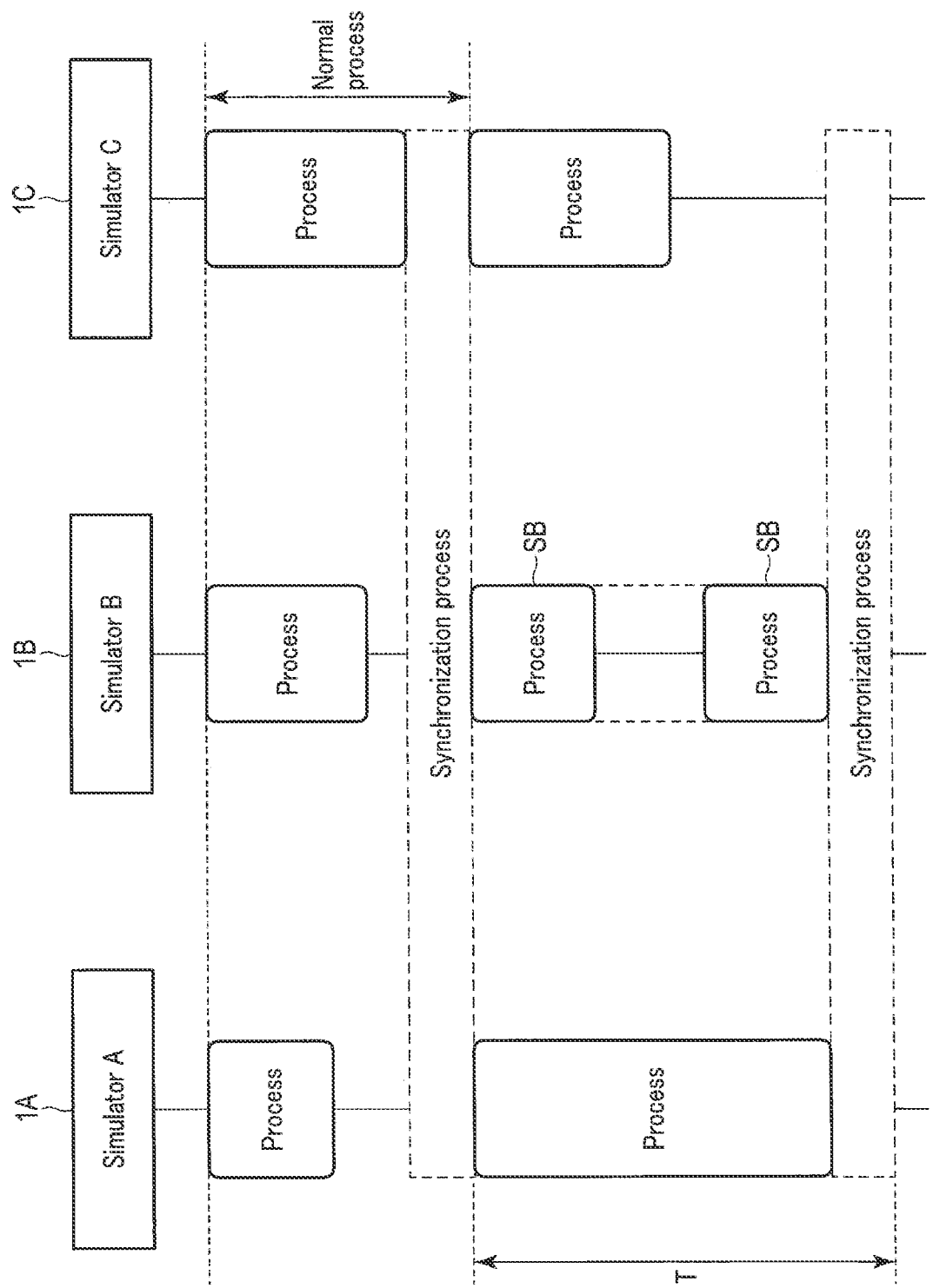
FIG. 7 is a view for describing a robustness improvement of a synchronization process by the distributed co-simulation controller of the present embodiment.

Besides, in the conventional art, in some cases, even with respect to simulators that normally operate, a simulator that is slow in processing, or a simulator 1B that temporarily halts processing, as illustrated in FIG. 6, is erroneously detected to be abnormal, and is separated from the synchronization process, resulting in the failure to continue the synchronization process. However, according to the above-described present anomaly detection method, a simulator that is slow in processing, or a simulator 1B that simply temporarily halts the process SB, as illustrated in FIG. 7, if no anomaly occurs therein, is not separated from the synchronization process, and the synchronization process can be continued, and the robustness of the synchronization process can be enhanced.

While certain embodiments of the present invention have been described, these embodiments have been presented by way of example only, and are not intended to limit the scope of the invention. These novel embodiments may be implemented in a variety of other forms, and various omissions, substitutions and changes may be made without departing from the spirit of the inventions. These embodiments and their modifications fall within the scope and spirit of the invention and within the inventions of the accompanying claims and their equivalents.

The invention claimed is:

1. An anomaly detection system that executes anomaly detection of each of one or a plurality of simulators by using a controller that executes a synchronization process of the one or plurality of simulators,
the controller including a processor configured to:
cause each simulator
to start a process of simulation that is to be executed in a predetermined period,
to transmit to the controller an existence notification indicative of existence of the simulator, at a predetermined cycle until an end of the process of simulation, and
to transmit to the controller an end notification indicative of an end of the process if the process ends;
determine that the simulator that is a transmission source of the existence notification is normal, upon receiving the existence notification at the predetermined cycle, and determine that the process of the simulator that is a transmission source of the end notification ends, upon receiving the end notification; and
detect, if the existence notification or the end notification is not transmitted at the predetermined cycle from a simulator, that an anomaly occurs in the simulator.

2. The anomaly detection system of claim 1, wherein the controller is configured to:
when a simulator that is determined to finish the process is present, if the existence notification is received from another simulator among the one or plurality of simulators, output to the simulator determined to finish the process a standby instruction not to start simulation that is to be executed in a predetermined period next to the predetermined period.

3. The anomaly detection system of claim 1, wherein the controller is configured to:
execute the synchronization process upon receiving the end notification from each of the one or plurality of simulators, and cause all of the simulators to start, after an end of the synchronization process, simulation that is to be executed in a predetermined period next to the predetermined period.

4. The anomaly detection system of claim 1, wherein the controller is configured to:
separate a simulator, in which the anomaly is determined to occur, from the synchronization process.

5. The anomaly detection system of claim 1, wherein the predetermined cycle is invariable.

6. The anomaly detection system of claim 1, wherein the predetermined cycle is variable.

7. A anomaly detection method of executing anomaly detection of each of one or a plurality of simulators by using a controller that executes a synchronization process of the one or plurality of simulators,
each of the simulators being configured to:
start, in accordance with an instruction from the controller, simulation that is to be executed in a predetermined period,
transmit to the controller an existence notification indicative of existence of the simulator, at a predetermined cycle until an end of a process of the simulation, and
transmit to the controller an end notification indicative of an end of the process if the process ends, and
the controller being configured to:
determine that the simulator that is a transmission source of the existence notification is normal, upon receiving the existence notification at the predetermined cycle, and determine that the process of the simulator that is a transmission source of the end notification ends, upon receiving the end notification; and
detect, if the existence notification or the end notification is not transmitted at the predetermined cycle from a simulator, that an anomaly occurs in the simulator.

8. The anomaly detection method of claim 7, wherein the controller is configured to:
when a simulator that is determined to finish the process is present, if the existence notification is received from another simulator among the one or plurality of simulators, output to the simulator determined to finish the process a standby instruction not to start simulation that is to be executed in a predetermined period next to the predetermined period.

9. The anomaly detection method of claim 7, wherein the controller is configured to:
execute the synchronization process upon receiving the end notification from each of the one or plurality of simulators, and cause all of the simulators to start, after an end of the synchronization process, simulation that is to be executed in a predetermined period next to the predetermined period.

10. The anomaly detection method of claim 7, wherein the controller is configured to:
separate a simulator, in which the anomaly is detected to occur, from the synchronization process.

11. The anomaly detection method of claim 7, wherein the predetermined cycle is invariable.

12. The anomaly detection method of claim 7, wherein the predetermined cycle is variable.

13. A non-transitory computer-readable medium on which a program is recorded, the program causing a processor to implement:
a function of causing each of one or a plurality of simulators, simulation results of which are subjected to a synchronization process, to start a process of simulation that is to be executed in a predetermined period, to transmit an existence notification indicative of existence of the simulator at a predetermined cycle until an end of the process of simulation, and to transmit an end notification indicative of an end of the process if the process ends;

a function of determining that the simulator that is a transmission source of the existence notification is normal if the existence notification is transmitted at the predetermined cycle, and determining that the process of the simulator that is a transmission source of the end notification ends if the end notification is transmitted; and a function of detecting, if the existence notification or the end notification is not transmitted at the predetermined cycle from a simulator, that an anomaly occurs in the simulator.

14. A distributed co-simulation system comprising:

one or a plurality of simulators each including an auxiliary function; and a controller connected to each of the simulators via a communication network, the controller including a processor configured to:

cause the auxiliary function of each simulator to start a process of simulation that is to be executed in a predetermined period, to transmit to the controller an existence notification indicative of existence of the simulator, at a predetermined cycle until an end of the process of simulation, and to transmit to the controller an end notification indicative of an end of the process if the process ends;

determine that the simulator that is a transmission source of the existence notification is normal, upon receiving the existence notification at the predetermined cycle, and determine that the process of the simulator that is a transmission source of the end notification ends, upon receiving the end notification; and detect, if the existence notification or the end notification is not transmitted at the predetermined cycle from the auxiliary function of a simulator, that an anomaly occurs in the simulator.

* * * * *